United States Patent [19]

Moriya

[11] Patent Number: 4,922,508
[45] Date of Patent: May 1, 1990

[54] METHOD AND APPARATUS FOR MULTIPLEXED VECTOR QUANTIZATION

[75] Inventor: Takehiro Moriya, Kodaira, Japan

[73] Assignee: Nippon Telegraph and Telephone Corporation, Tokyo, Japan

[21] Appl. No.: 261,859

[22] Filed: Oct. 25, 1988

[30] Foreign Application Priority Data

Oct. 30, 1987 [JP] Japan .................. 62-275388

[51] Int. Cl.$^5$ .................. H04B 1/10; H04B 14/04
[52] U.S. Cl. .................. 375/34; 375/122; 358/133
[58] Field of Search .......... 375/25, 26, 27, 37, 375/122, 37; 358/133, 135; 381/31, 36, 37, 40, 41, 43

[56] References Cited

U.S. PATENT DOCUMENTS

| | | | |
|---|---|---|---|
| 4,541,012 | 9/1985 | Tescher | 358/135 |
| 4,724,535 | 2/1988 | Ono | 375/122 |
| 4,772,946 | 9/1988 | Hammer | 358/133 |
| 4,791,654 | 12/1988 | DeMarca et al. | 375/122 |
| 4,797,739 | 1/1989 | Tanaka | 358/133 |
| 4,805,193 | 2/1989 | McLaughlin et al. | 375/27 |
| 4,811,398 | 3/1989 | Copperi et al. | 525/26 |

*Primary Examiner*—Benedict V. Safourek
*Assistant Examiner*—Stephen Chin
*Attorney, Agent, or Firm*—Pollock, Vande Sande and Priddy

[57] ABSTRACT

A vector quantization method and apparatus utilizes a plurality of codebooks each of which has a predetermined number of candidate vectors. A distortion between each input vector and an averaged vector of a set of candidate vectors, each selected from one of the codebooks, is calculated for all combinations of candidate vectors, and a combination of candidate vectors which provides the smallest distortion is determined. Codes representing the candidate vectors thus determined are multiplexed, thereafter being outputted.

35 Claims, 12 Drawing Sheets

METHOD AND APPARATUS FOR MULTIPLEXED VECTOR QUANTIZATION

BACKGROUND OF THE INVENTION

The present invention relates to a method for coding a signal sequence of speech or image with a small amount of information and, more particularly, to a multiplexed vector quantization method and apparatus therefor which are robust against transmission channel errors.

A vector quantization method is known as an effective method for coding a signal sequence with a small amount of information. According to this method, discrete values of successive signal samples to be coded are grouped for each predetermined number and defined as a vector for each group, each vector is checked with a codebook containing reconstruction vectors and the index of a reconstruction vector that will minimize a quantization distortion is used as an output code.

FIG. 1 shows the general arrangement for the conventional vector quantization method. Reference numerals 21 and 23 indicate codebooks, 22 an encoder and 24 a decoder. Symbols used herein have the following meanings:

u: input vector
u(i): i-th element of input vector u, where i=0, 1, . . . , k−1
k: vector dimension
r: code transmission rate [bits/sample]
b: transmitting code (kr bits)
Z: codebook
$z_l$: l-th reconstruction vector contained in codebook Z
z(i,l): i-th element of reconstruction vector $z_l$
M: number of reconstruction vectors $z_l$ contained in codebook Z, where $M=2^{kr}$ and l=0, 1, . . . , M−1
$d_l$: quantization distortion The codebooks 21 and 23 each have $M=2^{kr}$ reconstruction vectors $z_l$, where l=0, 1, . . . , M−1. At the transmitting side, the encoder 22 refers to the codebook 21 for each input vector u, calculates the quantization distortion $d_l$ represented by the square of the distance between each of the $M=2^{kr}$ reconstruction vectors $z_l$ and the input vector u, determines the reconstruction vector which yields the smalles distortion $d_l$, and sends its index l as the kr-bit long transmitting code b. The distortion $d_l$ is calculated using the following equation (1):

$$d_l = |u - z_l|^2 = \sum_{i=0}^{k-1} \{u(i) - z(i,l)\}^2 \quad (1)$$

At the receiving side, the decoder 24 refers to the codebook 23 on the basis of the received transmitting code b (i.e. the reconstruction vector index) and selects and outputs the reconstruction vector corresponding to the received transmitting code b.

This quantization method essentially has the defect of reconstructing a vector entirely different from the input vector when there are channel errors, because the index and the value of the reconstruction vector bear no relationship in terms of distance.

To avoid this, it is necessary in the prior art to suppress the code error rate by use of an error correcting code, that is, by imparting redundancy to the transmitting code. In this instance, the code error rate can significantly be lowered by, for example, using additional redundant bits the amount of which accounts for 50% of the amount of information bits involved. However, this method always requires the same amount of redundant bits even for an error-free channel. That is, where the total amount of information to be transmitted is fixed, the amount of information bits available is only ⅔ of the total amount of information to be sent even if the channel is free from errors, and the quantization distortion will naturally increase. In practice, the code error rate varies with time and it is difficult to modify the channel coding scheme in accordance with the varying error rate, so that it is inevitable to sacrifice the performance either for an error-free channel or for an erroneous channel. Accordingly, the use of error correcting codes is not always effective for reducing the quantization distortion in the case where the amount of information to be sent is fixed. Further, for the distance calculation (i.e. the calculation of the quantization distortion $d_l$) in the vector quantization by the conventional encoder 22 shown in FIG. 1, the codebook 21 is required to have a storage capacity for storing the $M=2^{kr}$ reconstruction vectors $z_l$, and the distortion $d_l$ must be calculated for each of the M reconstruction vectors. Therefore, the prior art has the disadvantage that the amount of computation and the storage capacity of the codebook each increase as an exponential function of the amount of information kr per vector.

SUMMARY OF THE INVENTION

An object of the present invention is to provide a vector quantization method and apparatus therefor in which the decoded signal is not seriously distorted even if a code error occurs in the coding of a signal sequence of speech or image through compression of its information and in which the amount of computation and/or the storage capacity of a memory necessary for the coding are both small.

According to the present invention, in a coding method in which an input signal sequence is separated into groups for each predetermined number of samples and each group is represented by one vector as the unit for quantization, a plurality of channels of codebooks are provided and, for each input vector, a set of candidate vectors which yield the smallest distortion between the input vector and the averaged vector of these candicate vectors are selected each from a different one of the codebooks in the respective channels, and then index codes of the respective candidate vectors are multiplexed and output as a transmitting code.

Thus, by quantizing each input vector with plural index codes through use of a plurality of codebooks and by transmitting the multiplexed index codes as mentioned above, an increase in the quantization distortion by a code error can be held small although the distortion for an error-free channel is a little larger than in the use of the conventional vector quantization.

DESCRIPTION OF THE PREFERRED EMBODIMENTS

Figure 2:
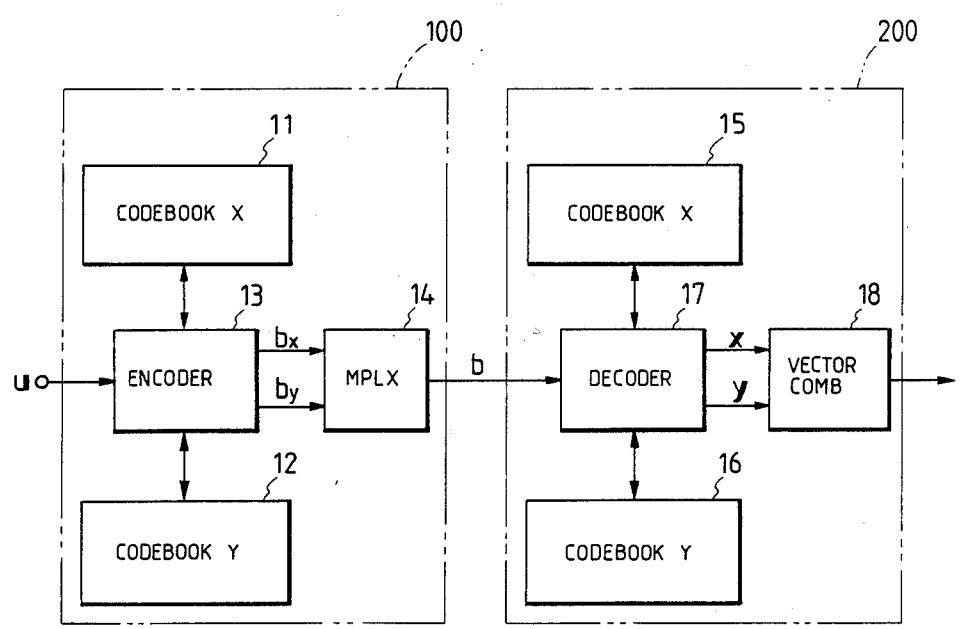
FIG. 2 is a block diagram illustrating the vector quantizer of the present invention and a decoder therefor.

FIG. 2 illustrates in block form the general arrangement of a transmission system which employs the vector quantizer according to an embodiment of the present invention. Reference numerals 11, 12 and 15, 16 indicate codebooks, 13 an encoder, 14 a multiplexer, 17 a decoder and 18 a vector combiner. This embodiment shows the case where codebooks of two channels are provided; namely, the codebooks 11 and 15 are X-channel and codebooks 12 and 16 Y-channel. Symbols used in the following description are defined as follows:

u: input vector k: vector dimension, i.e. the number of samples forming the input vector r: transmission rate (bits/sample)

b: transmitting code (kr bits)

X, Y: codebooks x(i, j): i-th element of a candidate vector $x_j$ from the codebook X y(i, m): i-th element of a candidate vector $y_m$ from the codebook Y u(i): i-th element of the input vector u, i.e. an i-th sample value N: number of candidate vectors ($=2^{kr/2}$) contained in each of the codebooks X and Y i: 0, 1, ..., k−1 j: 0, 1, ..., N−1 m: 0, 1, ..., N−1

In this embodiment the codebooks 11 and 12 each have $2^{kr/2}$ candidate vectors and the codebooks 15 and 16 at the receiving side also each contain $2^{kr/2}$ candidate vectors. The codebooks 11, 12 and 15, 16 of the respective channels are each prepared by determining candidate outputs in training through utilization of training samples which are statistically identical with inputs desired to be quantized. This will be described later on. Alternatively, vectors extracted from the training samples may be used as candidate output vectors.

In the vector quantizer at the transmitting side 100, upon application of one input vector u the encoder 13 refers to the two codebooks 11 and 12 and performs, for each of them, a vector quantization using half of the amount of information (k·r bits) assigned to the quantized transmitting code b. That is, the number of bits of each of quantized index codes $b_x$ and $b_y$ of the respective channels is represented by k·r/2. The multiplexer 14 multiplexes the quantized index codes $b_x$ and $b_y$ of the respective channels into the vector quantized code $b=b_x b_y$ represented by k·r bits, which is transmitted to the receiving side 200. At the receiving side 200, the decoder 17 refers to the codebooks 15 and 16 on the basis of the index codes $b_x$ and $b_y$ of the respective channels contained in the transmitted code b and obtains candidate vectors x and y of the respective channels. The vector combiner 18 obtains an arithmetic mean of the output vectors x and y, providing it as an ultimate reconstruction vector.

Figure 3:
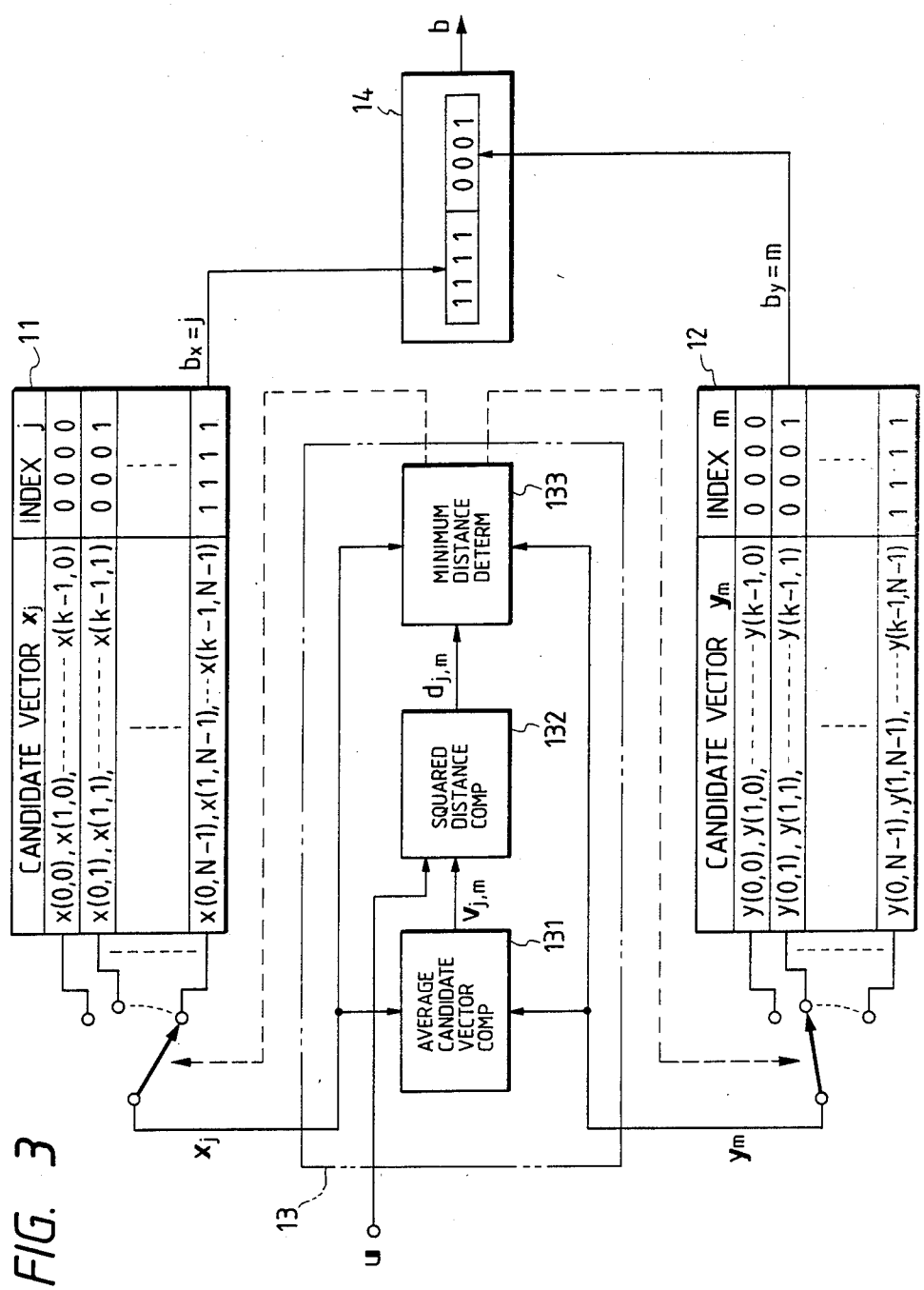
FIG. 3 is a block diagram illustrating in detail the vector quantizer of the present invention depicted in FIG. 2.

FIG. 3 illustrates a specific operative example of the arrangement of the vector quantizer 100 of the present invention. Each field of the X-channel codebook 11 contains a candidate vector $x_j$ and its vector index j (i.e. a quantized index code $b_x$). Similarly, each field of the Y-channel codebook 12 also contains a candidate vector $y_m$ and its vector index m (i.e. a quantized index code $b_y$). The numbers of candidate vectors $x_j$ and $y_m$ of the codebooks 11 and 12 of the respective channels are each $2^{kr/2}$ as mentioned above in respect of FIG. 2. Accordingly, the vector indices j and m (quantized index codes $b_x$ and $b_y$ for one transmission channel) are each composed of kr/2 bits. In FIG. 3, the vector indices j and m are each represented by four bits, for the sake of convenience.

Functionally, the encoder 13 can be separated into an average candidate vector computing section 131, a squared distance computing section 132 and a minimum distance determining section 133.

The average candidate vector computing section 131 computes an average vector $v_{j,m}$ $$v_{j,m} = (x_j + y_m)/2 \tag{2}$$

for all combinations of candidate vectors $x_j$ and $y_m$ of the X- and Y-channel codebooks 11 and 12 in a sequential order. The squared distance computing section 132 computes, for each of all combinations (j,m), a distortion $d_{j,m}$ between the input vector u and the above-mentioned average vector $v_{j,m}$ which is represented by a squared distance.

$$d_{j,m} = |u - v_{j,m}|^2 = |u - (x_j + y_m)/2|^2 \tag{3}$$

Since the number of each of the vector indices j and m is N, the squared distance computing section computes a total of $N^2$ distortion values $d_{j,m}$. It is apparent that $M=N^2$, which is the number of reconstruction vectors required for the codebook Z of the conventional system shown in FIG. 1.

The minimum distance determining section 133 sequentially receives each combination of the candidate vectors $x_j$ and $y_m$ of the two channels and the corresponding distortion $d_{j,m}$ between the input vector u and the average vector $v_{j,m}$ and determines a combination of candidate vectors $x_j$, $y_m$ which minimizes the distortion $d_{j,m}$. Based on the thus determined combination of candidate vectors $x_j$ and $y_m$, the minimum distance determining section 133 refers to the codebooks 11 and 12 and outputs their vector indices j and m as quantized index codes $b_x$ and $b_y$.

The vector indices j and m (i.e. quantized index codes $b_x$ and $b_y$) of the respective channels are multiplexed together by the multiplexer 14, providing the original vector quantized code b for the input vector u. FIG. 3 shows that the vector indices (i.e. quantized index codes) $b_x = 1111$ and $b_y = 0001$ of the X and Y channels are time-multiplexed into "11110001". It is also possible to employ frequency multiplexing and other diversity techniques for transmitting the index codes instead of using time multiplexing.

As will be evident from the above, according to the vector quantizer of the present invention in the case of using two codebooks as exemplified in FIG. 3, the candidate vectors $x_j$ and $y_m$ are selected from the two codebooks X and Y for the input vector u and the vector indices j and m are determined which minimize the distortion d between the average $(x_j + y_m)/2$ of the candidate vectors and the input vector u; so that the probability that the distance between the selected candidate vectors $x_j$ and $y_m$ is short is very high. Accordingly, in the case where these quantized index codes $b_x = j$ and $b_y = m$ are multiplexed together and transmitted as the vector quantized code $b = jm$, even if a one-bit error is contained in one of the first half (j) and second half (m) of the code b received at the receiving side in FIG. 2, one of their decoded vectors x and y would be correct if the other half does not contain any bit error, and accordingly the reconstructed vector, which is the average decoded output vector $(x+y)/2$, does not greatly differ from the input vector u at the transmitting side. In other words, the distortion of the decoded vector by a transmission channel error is decreased accordingly. Moreover, the memory in the embodiment of the present invention, described above in connection with FIGS. 2 and 3, needs only to store a total of 2N candidate vectors, since two codebooks are used each of which stores $N = 2^{kr/2}$ candidate vectors. In contrast thereto, the prior art vector quantization calls for a memory which stores $M = 2^{kr} = N^2$ reconstruction vectors.

The calculation of the squared distance $d_{j,m}$ shown by Eq. (3) can be expressed in more detail by the following equation (4). In the following description, however, x/2 and y/2 are replaced with x and y, respectively, for the sake of brevity.

$$d_{j,m} = \sum_{i=0}^{k-1} d_{j,m}(i) \qquad (4)$$
$$= \sum_{i=0}^{k-1} \{u(i) - x(i,j) - y(i,m)\}^2$$

Figure 4:
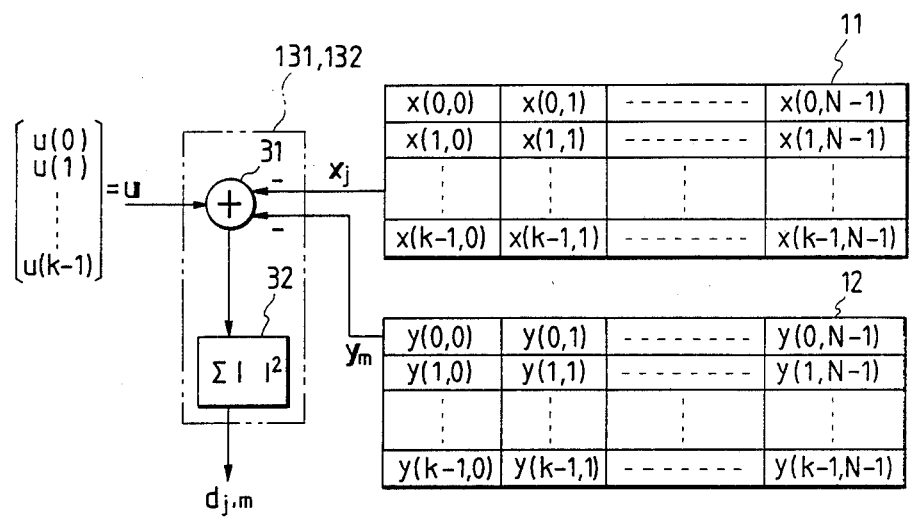
FIG. 4 is a block diagram showing an arrangement for performing a squared distance computation in the vector quantizer of the present invention depicted in FIG. 3.

In FIG. 4 there are shown, together with the codebooks 11 and 12, the arrangements of the average candidate vector computing section 131 and the squared distance computing section 132 in FIG. 3 in the case of calculating the distortion $d_{j,m}$ by the use of Eq. (4). For the input vector u, the candidate vectors $x_j$ and $y_m$ are read out of the X-channel codebook 11 and the Y-channel codebook 12, respectively, a calculation $u(i) - x(i,j) - y(i,m)$ is performed by an adder 31 using the corresponding i-th elements $u(i)$, $x(i,j)$ and $y(i,m)$ of the input vector and the candidate vectors, and the added output is squared and accumulated by a square accumulator 32. Such two additions (subtractions) and one square accumulation, that is, a total of three calculations, are performed k times for the corresponding elements $i = 0$ to $i = k-1$ of the vectors, thereby obtaining the distortion $d_{j,m}$ for the pair of the selected candidate vectors $x_y$ and $y_m$. The number of combinations of the candidate vectors $x_j$ and $y_m$ is $N^2$. In this instance, $3kN^2$ computation are needed for obtaining the distortion $d_{j,m}$ for each of the combinations and for determining the vector index pair (j,m) which provides the smallest distortion $d_{j,m}$. This amount of computation is larger than that needed in the conventional vector quantizer shown in FIG. 1 in which one subtraction and one square accumulation in Eq. (1) are performed $N^2$ times for the vector elements $i = 0$ to $i = k-1$. That is, the embodiment of the present invention depicted in FIG. 4 is defective in that the amount of computation needed is larger than in the case of FIG. 1 although the total storage capacity required of the codebooks 11 and 12 is markedly smaller. Next, a description will be given, with reference to FIG. 5, of an embodiment improved in this respect.

Eq. (4) can be expanded to the following equation (5):

$$d_{j,m} = \sum_{i=0}^{k-1} [u^2(i) - 2u(i)\{x(i,j) + y(i,m)\}] + F(j,m) \qquad (5)$$

where $$F(j,m) = \sum_{i=0}^{k-1} \{x(i,j) + y(i,m)\}^2 \qquad (6)$$

The first term of Eq. (5) has nothing to do with the selected candidate vector index pair (j, m). Accordingly, there is no need of calculating $u^2(i)$ for determining the vector index pair (j, m) which provides the smallest distortion $d_{j,m}$. Then it is sufficient to determine the vector index pair of (j, m) which yields the smallest distortion $d'_{j,m}$ which is defined by the following equation (7), instead of Eq. (5).

$$d'_{j,m} = \sum_{i=0}^{k-1} -2u(i) \cdot \{x(i,j) + y(i,m)\} + F(j,m) \qquad (7)$$

In Eq. (7) the second term F(j,m) is unrelated to the input vector u as defined by Eq. (6) and can be calculated from only the candidate vectors $x_j$, $y_m$ selected from the codebooks X and Y. Therefore, the amount of computation for Eq. (7) could be reduced by prestoring in a memory the results of calculation of F(j, m) in Eq. (7) for all combinations of vector indices ($N^2$ combinations) and by reading out the corresponding calculated value of F(j, m) when calculating the distortion $d'_{j,m}$ by Eq. (7).

Figure 5:
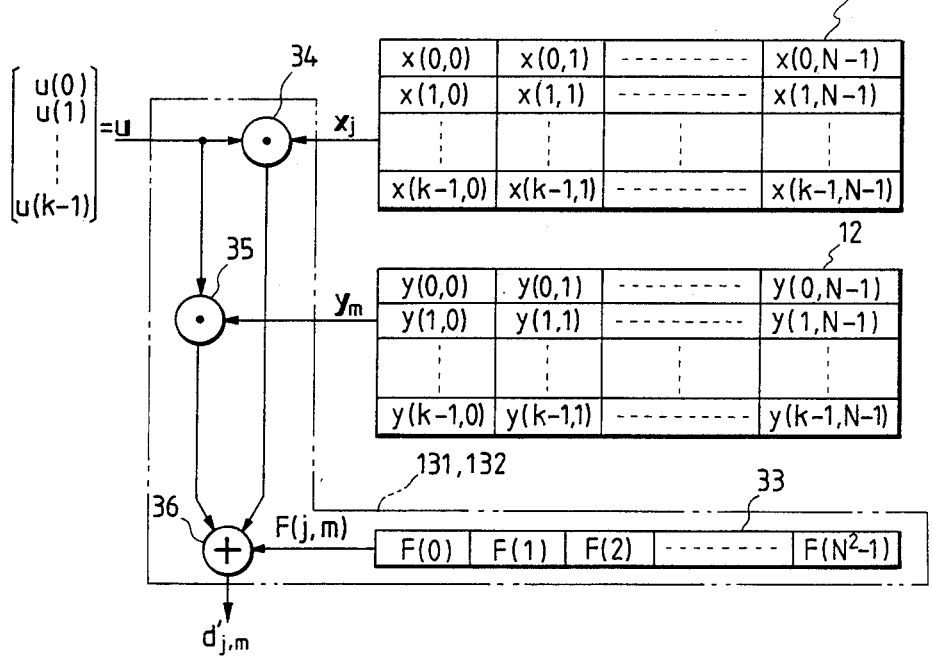
FIG. 5 is a block diagram showing another example of the arrangement for the squared distance computation in the embodiment depicted in FIG. 3.

FIG. 5 illustrates an example in which the averaged candidate vector computing section 131, the squared distance computing section 132 and the codebooks 11 and 12 in the embodiment of FIG. 3 are arranged on the basis of Eq. (7). In this example, a table memory 33 is provided which has stored therein the values of F(j, m) calculated for all the combinations of vector indices (j, m) by Eq. (6) as described above. The first term of Eq. (7) is the sum of the inner product of the vectors u and $x_j$ and the inner product of the vectors u and $y_m$, which are calculated by inner product calculators 34 and 35, respectively. The inner product calculated results are each provided as a scalar value to an adder 36, wherein they are added to the corresponding value of F(j, m) read out of the table memory 33. The output of the adder 36 is the result of calculation of the distortion $d'_{j,m}$ by Eq. (7). This embodiment involves 2kN inner product calculations by the inner products calculators 34 and 35 and $2N^2$ scalar additions/subtractions by the adder 36 and requires a storage capacity 2kN for the codebooks 11 and 12 and a storage capacity $N^2$ for the table memory 33.

Figure 1:
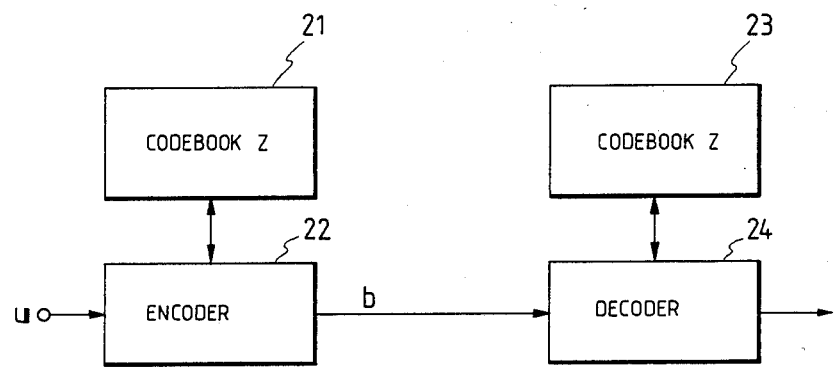
FIG. 1 is a block diagram showing an encoder at the transmitting side and a decoder at the receiving side in a conventional vector quantization system which employs one codebook.

The following Table I shows the storage capacities and the amounts of computation needed in the conventional vector quantizer of FIG. 1 and in the embodiments of FIGS. 4 and 5, with k=16 and N=16.

TABLE I

| | Amount of computation (number of steps) | | k = 16, N = 16 Storage capacity (number of words) | |
|---|---|---|---|---|
| FIG. 1 (1) | $2 kN^2$ | (8192) | $kN^2$ | 4096 |
| FIG. 4 (2) | $3 kN^2$ | (12288) | 2 kN | 512 |
| FIG. 5 (3) | $2 N^2 + 2 kN$ | (1024) | $2 kN + N^2$ | 768 |

The above embodiments have been described to utilize the squared distance for expressing the quantization distortion $d_{j,m}$ or $d'_{j,m}$. These embodiments can be applied to vector quantization of a spectrum envelope parameter after transforming it to an LSP parameter or log area ration in speech coding. For high efficiency quantization of a speech waveform signal or prediction residual signal, however, it is necessary to perform an adaptive weighted distance calculation in a frequency domain. A distance measure in such a case is expressed as follows:

$$d_{j,m} = \sum_{i=0}^{k-1} w(i) \{u(i) - x(i,j) - y(i,m)\}^2 \quad (8)$$

$$j = 0, \ldots, N - 1; \, m = 0, \ldots, N - 1$$

In the above, w(i) indicates an i-th element of a weighting vector w, which changes each time the i-th element u(i) of the input vector u changes but remains unchanged together with the i-th element u(i) during the calculation of the minimum value of the distortion d. Incidentally, if w(i) is fixed regardless of u(i), then the case becomes that of utilizing the squared distance expressed by Eq. (4). Developing Eq. (8), omitting the first term which does not contribute to the determination of the minimum distortion and letting d* represent the remaining equation including the second and third terms, it follows that $$d^*_{j,m} = \sum_{i=0}^{k-1} [-2w(i)u(i)\{x(i,j) + y(i,m)\}] + \sum_{i=0}^{k-1} w(i)F(i,j,m) \quad (9)$$

$$j=0, 1, \ldots, N-1; \, m=0, 1, \ldots, N-1$$

$$F(i,j,m) = \{x(i,j) + y(i,m)\}^2 \quad (10)$$

In order to precalculate and prestore all elements of F(i,j,m) in Eq. (10), a memory with a capacity $kN^2$ is needed unlike in the case of Eq. (6). Furthermore, $kN^2$ inner product operations are required for calculating the second term of Eq. (9) as defined by the following Eq. (11).

$$E(j,m) = \sum_{i=0}^{k-1} w(i)F(i,j,m) \quad (11)$$

For calculating the first term of Eq. (9), s(i) which is defined by the following equation (12) is precalculated only once for i=0, 1, ..., k−1.

$$s(i) = -2w(i)u(i) \quad (12)$$

Moreover, the inner product operation of N elements is performed twice for s(i), thereby obtaining G and H which are defined by the following equations (13) and (14).

$$G(j) = \sum_{i=0}^{k-1} s(i)x(i,j) \quad (13)$$

$$H(m) = \sum_{i=0}^{k-1} s(i)y(i,m) \quad (14)$$

As a result of these preparations, $d^*_{j,m}$ of Eq. (9) is obtained by the following scalar operation:

$$d^*_{j,m} = G(j) + H(m) + E(j,m) \quad (15)$$

Figure 6:
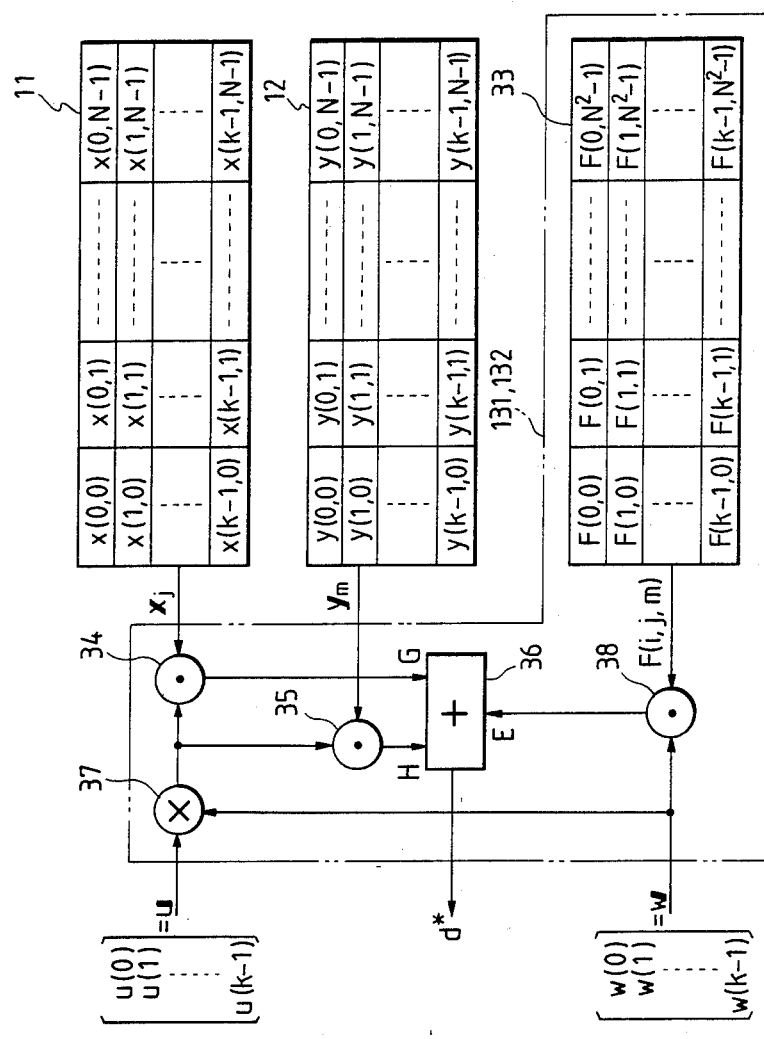
FIG. 6 is a block diagram showing an arrangement for performing a weighted squared distance computation in the embodiment depicted in FIG. 3.

FIG. 6 illustrates an arrangement for executing the above-described computation in the embodiment of FIG. 3. The table memory 33 has prestored $kN^2$ values of F(i,j,m) given by Eq. (10). The weighting vector w is input into the vector quantizer, together with the input vector u, and the corresponding i-th elements of these vectors are multiplied by a multiplier 37 as expressed by Eq. (12). The thus obtained weighted input vectors s(i) (where i=0, 1, ..., k−1) are provided to the inner product calculators 34 and 35, wherein the inner products of the weighted vectors and the candidate vectors $x_j$ and $y_m$ read out of the codebooks 11 and 12, expressed by Eqs. (13) and (14), respectively, are obtained. On the other hand, the weighting vector w is provided to an inner product calculator 38, wherein the inner product of the weighting vector and the vector F(i,j,m) (where i=0, 1, ..., k−1) read out of the table memory 33 in correspondence with the vector index pair (j, m), expressed by Eq. (11), is calculated. The calculated outputs from the inner product calculators 34, 35 and 38 are applied to the adder 36, wherein the scalar operation of Eq. (15) takes place, obtaining the value $d^*_{j,m}$ corresponding to the distortion in the case where the input vector u is encoded into j,m.

The following Table II shows the amount of computation and the storage capacity needed in the embodiment of FIG. 6. In Table II there are also shown, for the purpose of comparison, the amount of computation and the storage capacity which are required in the cases where the weight w is included in Eq. (1) corresponding to FIG. 1 and Eq. (4) corresponding to FIG. 4 as is the case with Eq. (8), but no description will be given of them, because they can easily be obtained in the same manner as described above.

TABLE II

|  | Amount of computation (Number of steps) | | k = 16, N = 16 Storage capacity (Number of words) | |
|---|---|---|---|---|
| (1) (FIG. 1) | $3 kN^2$ | (12288) | $kN^2$ | (4096) |
| (2) (FIG. 4) | $4 kN^2$ | (16384) | $2 kN$ | (512) |
| (3) (FIG. 6) | $k(1 + 2N + N^2)$ | (5136) | $2 kN + N^2$ | (4608) |

In the case of utilizing the weighted distance, the methods (2) and (3) are each larger in either the amount of computation or storage capacity than in the method (1), but by combining the methods (2) and (3) both the amount of computation and the storage capacity can be reduced as compared with those in the method (1). This can be achieved by partly prestoring, in the form of a table, the values of F(i,j,m) in Eq. (9). Letting the ratio of the number of values to be prestored to the total number of values of F(i,j,m) be represented by λ (where 0 < λ < 1), the amount of computation and the storage capacity required are $2N^2 + k + 2kN + (3-2\lambda)$ and $2kN + \lambda kN^2$, respectively. A suitable selection of the above-mentioned ratio λ will permit a trade-off between the amount of computation and the storage capacity so as to meet given requirements of design.

It is also possible to further expand F(i,j,m) in Eq. (10) and store values of respective terms in separate tables. In this case, the amount of computation and the storage capacity are both larger than in the case of the method (3), but it is possible to partly or wholly eliminate the computation of a product term $x(i,j) \cdot y(i,m)$ and approximate the distortion $d^*_{j,m}$. At this time, the code which minimizes the distortion cannot always be selected but the amount of computation and the storage capacity can significantly be reduced.

Furthermore, the present invention can also be applied easily to the case where the distance measure includes a free parameter τ which is multiplied with the candidate vectors in the codebooks as shown in Eq. (16).

$$d_{j,m} = \sum_{i=0}^{k-1} w(i) \{u(i) - \tau x(i,j) - \tau y(i,m)\}^2 \qquad (16)$$

$$j = 0, \ldots, N-1; m = 0, \ldots, N-1$$

A distortion measure expressed by the following equation has often been utilized in the quantization of a residual signal of speech in the time domain.

$$d_l = \sum_{i=0}^{k-1} \left[ u(i) - \tau \sum_{g=0}^{k-1} h(i,g) z(g,l) \right]^2$$

$$l = 0, 1, \ldots, M - 1$$

The calculation of this distortion $d_l$ is performed using one codebook Z. Adopting this distortion measure, the distortion $d_{j,m}$ in the vector quantization method of the present invention can be expressed as follows:

$$d_{j,m} = \sum_{i=0}^{k} \left[ u(i) - \tau \sum_{g=0}^{k-1} h(i,g)\{x(g,j) + y(g,m)\} \right]^2$$

where h(i,g) is an element at an i-th row and a g-th column of a matrix H for obtaining a convolution product and τ is a parameter which is determined so that the distortion $d_{j,m}$ becomes minimum.

The definitions of the distortion $d_{j,m}$ by Eqs. (3), (4) and (5) reflect the performance for an error-free channel. The definition of the distortion by the following equation (17) is also effective for further robustness against transmission code errors.

$$d_{j,m} = \mu |u - v_{j,m}|^2 + (1+\mu)\{|u - x_j|^2 + |u - y_m|^2\}/4 \qquad (17)$$

where μ is a parameter from 0 to 1. If μ is set to 1, then the above distortion will be equivalent to the distortion by Eq. (3), and if μ is selected smaller, then the redundancy of each codebook will increase, permitting the reduction of the distortion if one of the two channels is free from errors. That is, the robustness against transmission channel errors is increased.

Taking transmission channel errors into account, the following equation can be considered as the definition of the distortion for $x_j$ and $y_m$ selected for the input vector u.

$$d_{j,m} = \sum_{f=0}^{N-1} \sum_{g=0}^{N-1} |u - (x_f + y_g)/2|^2 g(f|j) q(g|m)$$

where q(f|j) indicates the conditional probability that the vector index j erroneously changes to f in the channel. This also applies to q(m|g).

These distortion measures are based on the squared distance, but they can easily be applied to the aforementioned weighted squared distance and other measures. Further, in the above the final output reconstruction vector is produced at the receiving side as a simple arithmetic average, since it is assumed that the same amount of information is distributed to a plurality of channels; however, when the amount of information differs with the channels, the final output reconstruction vector is produced as a weighted average. For example, in the case of using two channels and the squared distance, the weighted average vector needs only to be obtained as follows:

$$v_{j,m} = \{2^{2r(x)} x_j + 2^{2r(y)} y_m\} / \{2^{2r(x)} + 2^{2r(y)}\}$$

where r(x) and r(y) are the transmission rates of the respective channels x and y. This is based on the fact that an expected value of the quantization distortion in the channel x can be approximated to $2^{-2r(x)}$.

Figure 7:
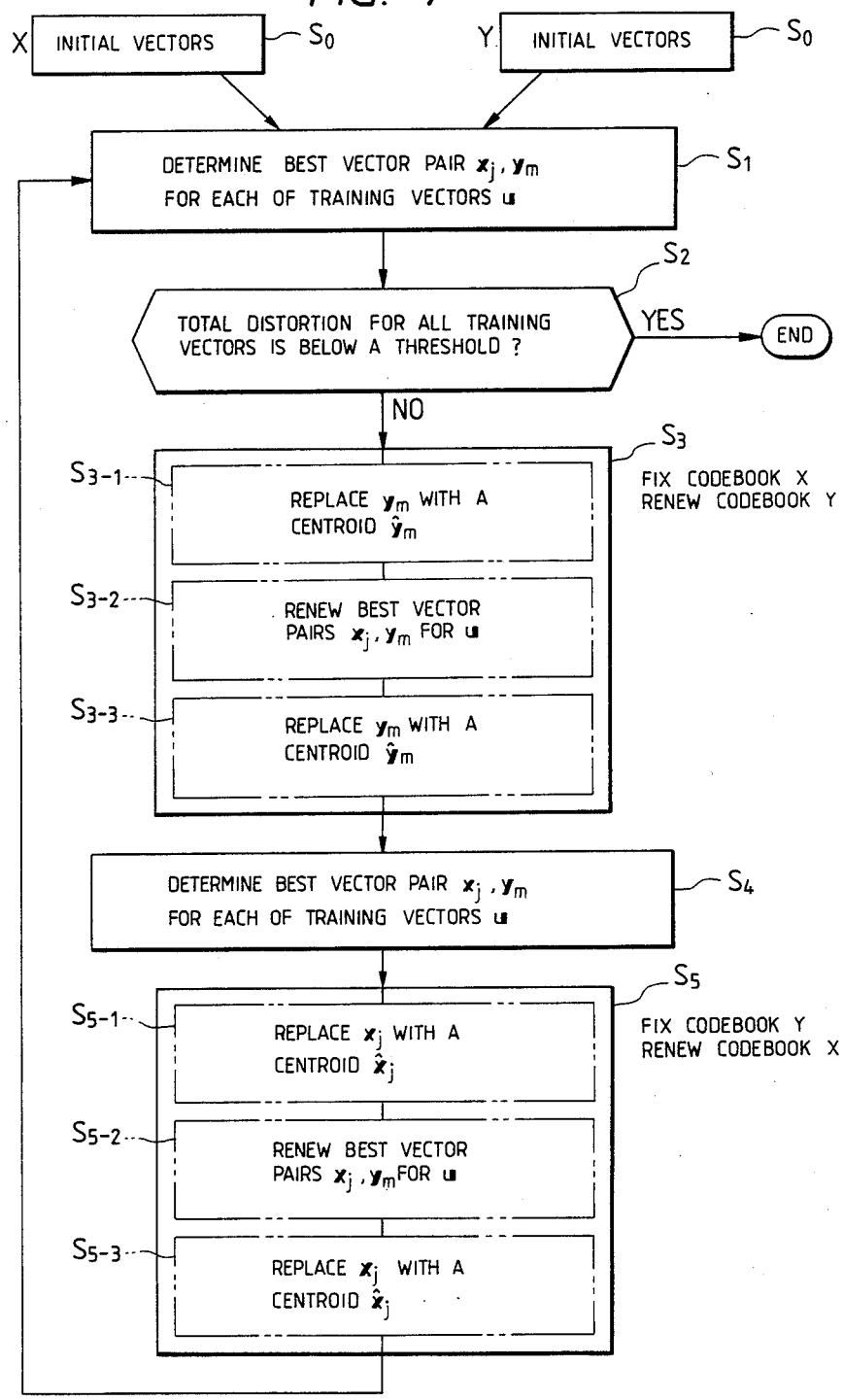
FIG. 7 is a flowchart showing a training sequence for producing two codebooks which are employed in the vector quantizer of the present invention.

Next, a description will be given, with reference to FIG. 7, of the procedure for preparing the two codebooks 11 and 12 for use in the embodiments of the present invention shown in FIGS. 2 to 6. The flowchart of FIG. 7 shows the case of locally minimizing the distortion by alternate renewal of the two codebooks, but the procedure shown can also be applied to the preparation of more than two codebooks.

In step $S_0$ a number of vectors are prepared which are each composed of k consecutive samples extracted from a training sample sequence at an arbitrary position, and these vectors are separated into two groups, each consisting of initial candidate vectors of the same number, by which initial codebooks X and Y are prepared. Alternatively, a group of vectors obtained by ordinary vector quantization training through use of training samples may be used as the codebook X and a group of vectors obtained using a sequence of its errors may be used as the codebook Y.

Next, in step $S_1$ training vectors sufficiently greater in number than the candidate vectors are used as input vectors u and the distortion d, for example, by Eq. (3) between each input vector u and every candidate vector pair $x_j$, $y_m$ is calculated, thereby determining the candidate vector pair $x_j$, $y_m$ which provides the smallest distortion d. In other words, each input vector u is quantized by the quantization method of the present invention and the candidate vector pair $x_j$, $y_m$ is determined to which each input vector u corresponds.

In step $S_2$ the sum total D of the minimum distortions d calculated in step $S_1$ for all input vectors is calculated, and if the sum total D or its improvement ratio is below a threshold value, then it is judged that the codebooks X and Y are composed of candidate vectors desired to obtain, and the training is stopped. If not so, the training sequence proceeds to step $S_3$, in which the contents $y_m$ of the codebook Y are renewed, with the contents $x_j$ held unchanged.

That is, in step $S_{3-1}$, with respect to all the candidate vector pairs $(x_j, y_m)$ determined in step $S_1$ to correspond to the respective input vectors u, each of the candidate vectors $y_m$ is regarded as a variable vector; an equation expressing the sum of distortions of all input vectors u corresponding to those vector pairs which contain the same variable vector $y_m$, is partially differentiated by the variable vector $y_m$ and set to zero; and a vector value $y_m$ obtained by solving the differentiated equation for the variable vector $y_m$ is used as a new candidate vector $y_m$. Letting all of P (where P is variable) input vectors containing the candidate vector $y_m$ in their corresponding vector pairs be represented by $u_{m1}$, $u_{m2}$, ..., $u_{mP}$ and the corresponding vector pairs by $(x_{f1}, y_m)$, $(x_{f2}, y_m)$, $(x_{f3}, y_m)$, ..., $(x_{fP}, y_m)$, the vector value $y_m$ is given as their centroid by the following equation:

$$y_m = \frac{1}{P} \sum_{e=1}^{P} (2u_{me} - x_{fe})$$

This is followed by step $S_{3-2}$, in which the fixed codebook X and the renewed codebook Y are used to determine the correspondence of each input vector u to the candidate vector in the codebook Y, with the correspondence of each input vector u to the candidate vector in the codebook X fixed in the state in step $S_1$. Then, in step $S_{3-3}$ the codebook Y is renewed again in the same manner as in step $S_{3-1}$.

In step $S_4$ a candidate vector pair $(x_j, y_m)$ corresponding to each input vector u is determined using the codebook X and the renewed codebook Y. Step $S_4$ is equivalent to step $S_1$.

In step $S_5$ the contents of the codebook X are renewed, with the contents of the codebook Y fixed. That is, in step $S_{5-1}$ the candidate vector $x_j$ is regarded as a variable vector for the candidate vector pairs $(x_j, y_m)$ corresponding to the respective input vectors u, determined in step $S_4$; an equation expressing the sum of distortions of all input vectors u corresponding to those vector pairs which contain the same variable vector $x_j$, is partially differentiated by the variable vector $x_j$ and set to zero; and a value $x_j$ obtained by solving the differentiated equation for the variable vector $x_j$ is used as a new candidate vector $x_j$. Letting all of Q (where Q is variable) input vectors containing the candidate vector $x_j$ in their corresponding vector pairs be represented by $u_{j1}$, $u_{j2}$, ..., $u_{jQ}$ and the corresponding vector pairs by $(x_j, y_{g1})$, $(x_j, y_{g2})$, ..., $(x_j, y_{gQ})$, the vector $x_j$ is given as their centroid by the following equation:

$$x_j = \frac{1}{Q} \sum_{e=1}^{Q} (2u_{je} - y_{ge})$$

Next, in step $S_{5-2}$ the renewed codebook X and the fixed codebook Y are used to determine the correspondence of each input vector u to the candidate vector in the codebook X, with the correspondence of each input vector u to the candidate vector in the codebook Y fixed in the state in step $S_4$. Then, in step $S_{5-3}$ the codebook X is renewed again in the same manner as in step $S_{5-1}$.

The training sequence goes back to step $S_1$, thereafter performing the same iterative operations as mentioned above in step $S_2$ to $S_5$. The renewal of the codebooks X and Y is continued until the sum total D of the distortions or its improvement ratio becomes smaller than the threshold value.

In the above, steps $S_{3-2}$, $S_{3-3}$ and $S_{5-2}$, $S_{5-3}$ may also be omitted. Further, these steps may also be repeated alternately.

Figure 8:
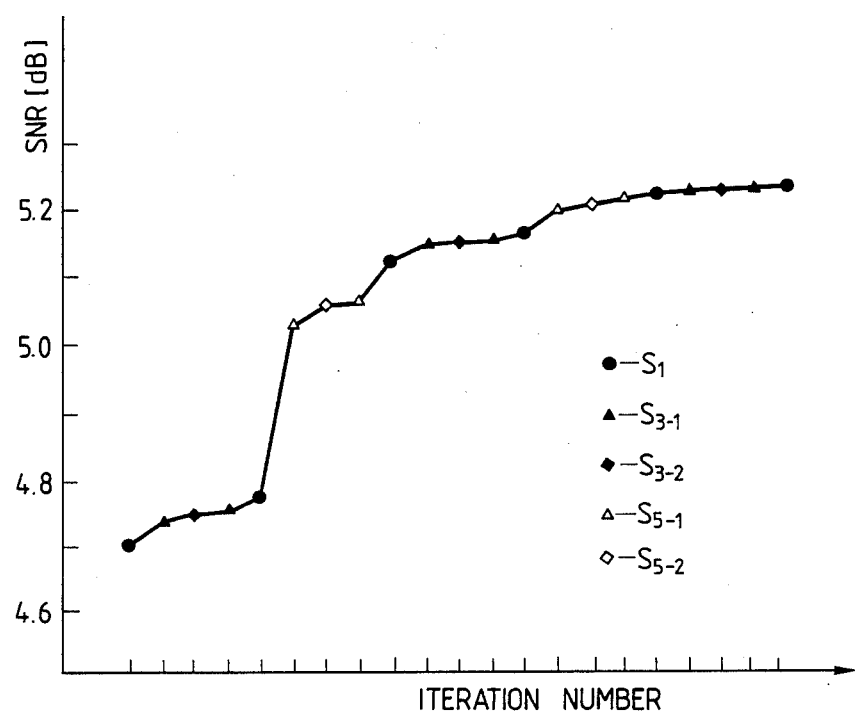
FIG. 8 is a graph showing improvement of the codebook by the iteration of the training sequence following the flowchart depicted in FIG. 7.

FIG. 8 shows, in terms of SNR, how the distortion is reduced by the codebook training. In FIG. 8, symbols , , , ∆ and correspond to the steps $S_1$, $S_{3-1}$, $S_{3-2}$, $S_{5-1}$ and $S_{5-2}$ in the flowchart of FIG. 7, respectively. The distortion always decreases, no matter how many times the pair of steps $S_{3-1}$ and $S_{3-2}$ and the pair of steps $S_{5-1}$ and $S_{5-2}$ may be iterated.

Figure 9A:
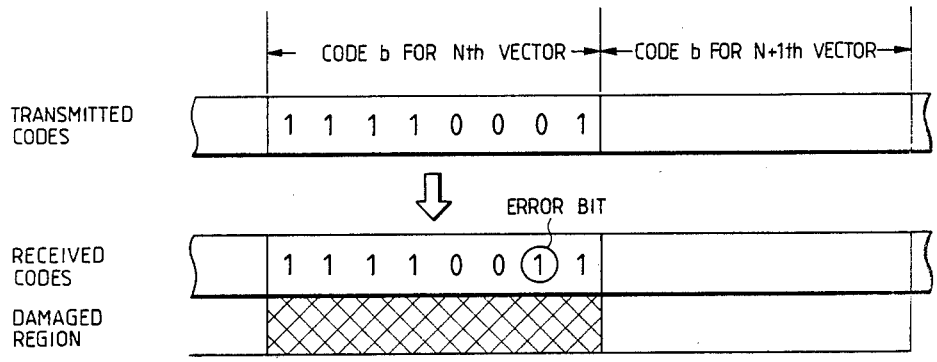
FIGS. 9A and 9B are diagrams for comparing the regions of damage by a code error in the conventional vector quantization method and the vector quantization method of the present invention.
Figure 9B:
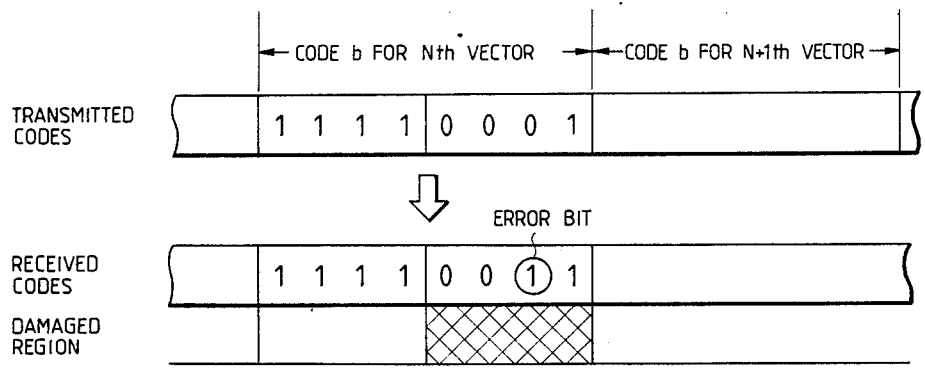

FIGS. 9A and 9B show a performance comparison between the conventional single-channel quantizer depicted in FIG. 1 (FIG. 9A) and the two-channel quantizer of the present invention (FIG. 9B) in terms of the region of the damage by a transmitted code error, the error bit being encircled. Since the provision of plural channels of codebooks and plural transmitting codes for each input vector divides the unit in which the codes are transmitted, the probability of occurrence of code errors in all the channels is lower than the error rate of ordinary transmitted codes which are not divided in their transmission unit. In other words, the region of the damage by a code error of one bit in the case of the two channels is one-half that in the case of one channel, as indicated by hatching in FIGS. 9A and 9B.

Figure 10:
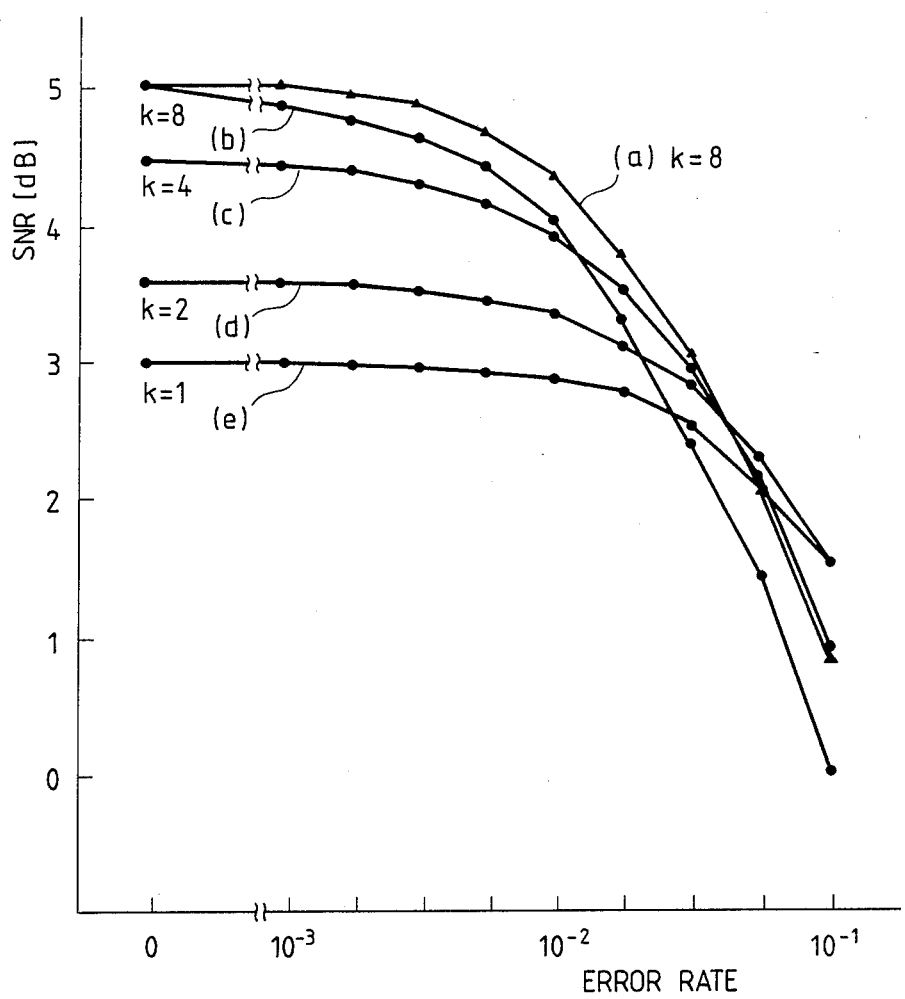
FIG. 10 is a graph showing the comparison between the vector quantization method of the present invention and the conventional vector quantization method in terms of SNR for the code error rate.

FIG. 10 shows the performance of the vector quantizer of the present invention for a signal sequence having a memoryless Laplacian distribution in the case of r=1. The Laplacian distribution simulates a linear prediction residual signal of a speech signal. In FIG. 10, the curve (a) indicates the two-channel quantization and the curves (b) to (e) the conventional single-channel quantization. The abscissa represents a bit error rate and the ordinate SNR. It appears from FIG. 10 that the two-channel quantizer has about the same performance as the single-channel quantizer of the same dimension in the case of no code error but is superior to the latter when there are code errors.

Figure 11:
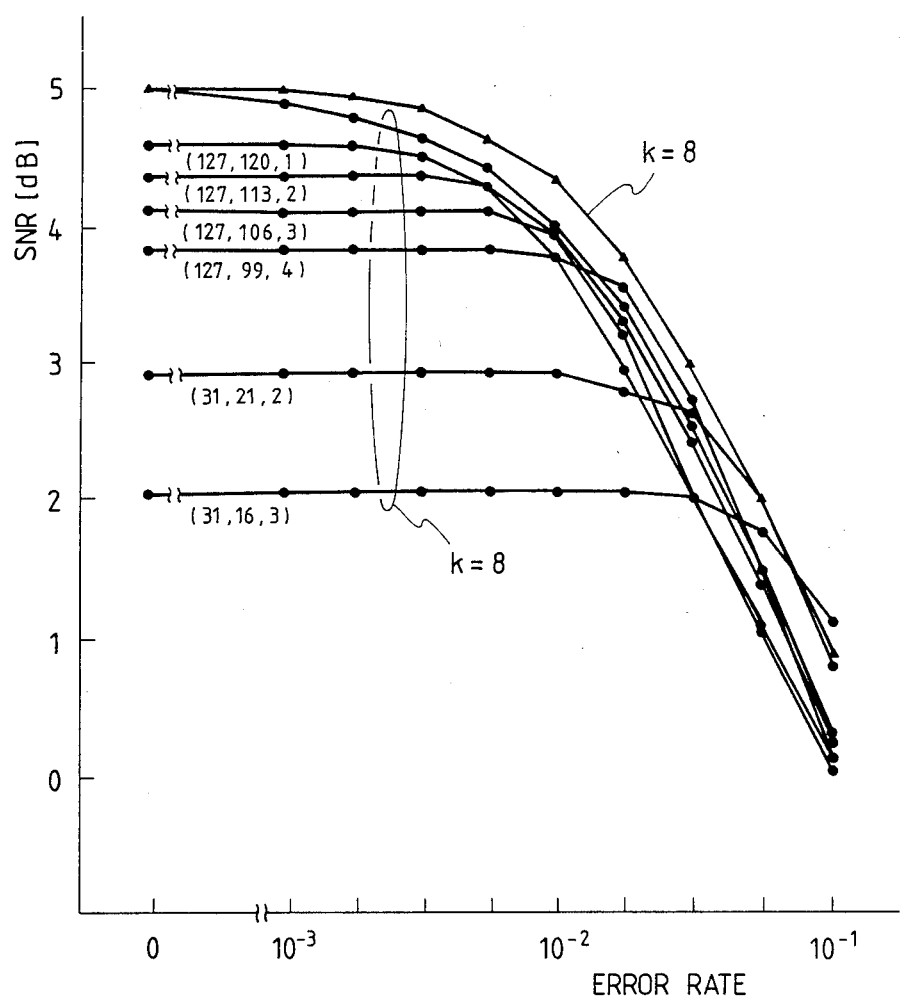
FIG. 11 is a graph showing the effect of the vector quantization method of the present invention in comparison with the effect of the conventional method.

FIG. 11 shows the performance of the two-channel quantizer according to the present invention in comparison with conventional quantizers using vector quantized codes and error correcting codes, with the total amount of information fixed. In this case, the correcting codes used are seven kinds of BCH codes capable of a multiple error correction. The numerals in the parentheses represent the total number of information bits, the number of source bits and the number of error correctable bits. These conventional quantizers are defective in that the distortion is increased by redundant bits and that the distortion rapidly increases when the number of code errors exceeds a predetermined value. Accordingly, the quantizers of the present invention are advantageous over conventional quantizers.

Figure 12:
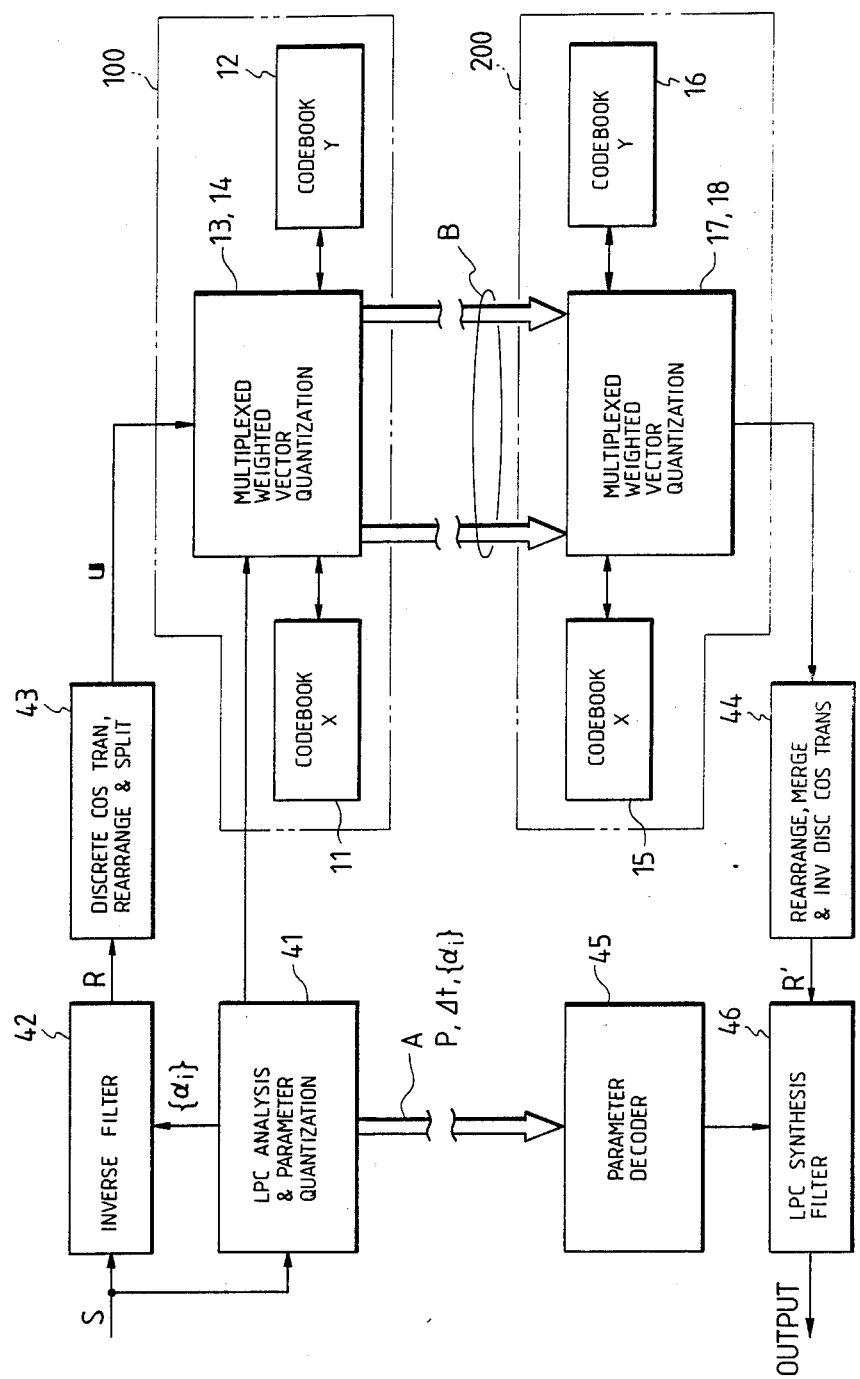
FIG. 12 is a block diagram illustrating a transmission system in the case of applying the vector quantization method of the present invention to weighted vector quantization of a residual waveform in the frequency domain.

In FIG. 12 an example of the two-channel vector quantization of the present invention is shown as being applied to the transform coding of speech with weighted vector quantization which is one of the effective techniques for medium band speech coding. An input digital speech signal S is applied to a linear prediction analyzer 41, from which a set of linear prediction parameters $\{\alpha_i\}$ are provided as filter coefficients to an inverse filter 42, providing a linear prediction residual signal R. The residual signal R is cosine-transformed by a cosine transformer 43 and its DCT (Discrete Cosine Transformation) coefficients are rearranged on the frequency axis and split into a plurality of sub-vectors. A vector u thus obtained is provided to a two-channel weighted vector quantizer 100 according to the present invention, in which the input vector u is subjected to vector quantization by being added with the weight of a spectral envelope, and from which the quantized code is transmitted as waveform information B. At the same time, side information A which consists of a pitch period $\Delta t$, the linear prediction parameters $\{\alpha_i\}$ and signal power P is also encoded and transmitted. A decoder 200 at the receiving side refers to the codebooks 15 and 16 and reconstructs the candidate vector pair $x_j$, $y_m$ from the received waveform information B and then outputs their averaged vector as a reconstruction vector from the decoder 17 and 18. The reconstruction vector is applied to a cosine inverse transformer 44, by which a residual signal R' is decoded. On the other hand, the received parameter information A is decoded by a parameter decoder 45, and the linear prediction parameters $\{\alpha_i\}$ are applied as filter coefficients to a synthesis filter 46. The residual signal R' is applied to the synthesis filter 46, synthesizing speech.

The codebooks 11, 12 (and 15, 16) for the two-channel quantization are prepared by training first from a Gaussian random number sequence using a distortion measure weighted with a long-term averaged spectrum. The vector produced at this time is substantially zero in the power of a component corresponding to the high-frequency band on the frequency axis, resulting in decoded speech lacking the high-frequency component. To alleviate this, the candidate vector is replaced with a vector which is the smallest in the weighted distance among the Gaussian random numbers of the training sequence.

Figure 13:
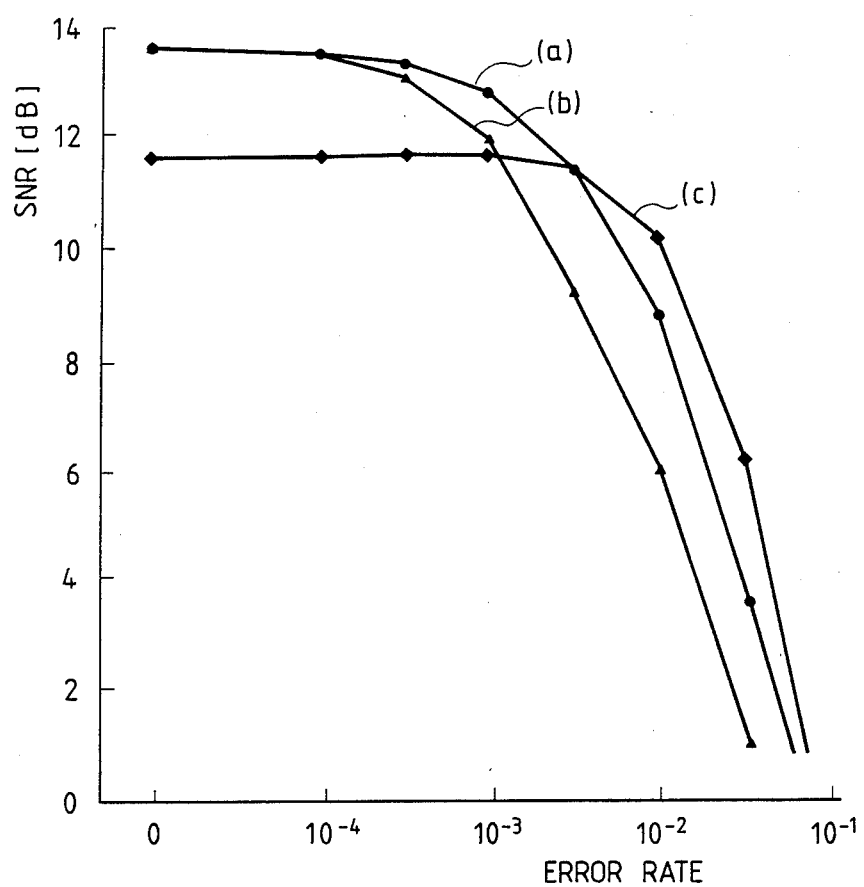
FIG. 13 is a graph showing SNR for a code error in a transmission system depicted in FIG. 12 in comparison with SNR in the case of using the conventional vector quantization method.

FIG. 13 shows the SNR performance of the two-channel vector quantization for transmission channel errors in FIG. 12, in comparison with the SNR performance of the conventional single-channel vector quantization depicted in FIG. 1. The input speech S is male and female speech, which are repeatedly used in different code error patterns, and the SNR plots represent values averaged over about 90 seconds of speech. The curves (b) and (c), except (a), indicate the case where the ordinary single-channel vector quantization was used for waveform quantization. In the side information B in all the cases of the curves (a), (b) and (c) and the waveform information A in the case of curve (c) an error correction was made using double error correctable BCH codes (31, 21). The reason for this is that since the side information accounts for around 20% of the whole information, an increase in its waveform distortion by redundant bits of the error correcting codes is slight, whereas the waveform information is seriously damaged when an error occurs. It will be seen from FIG. 13 that the two-channel vector quantization can make the waveform distortion smaller than the other methods over the range of error rates from zero to 0.3% or so.

Figure 14:
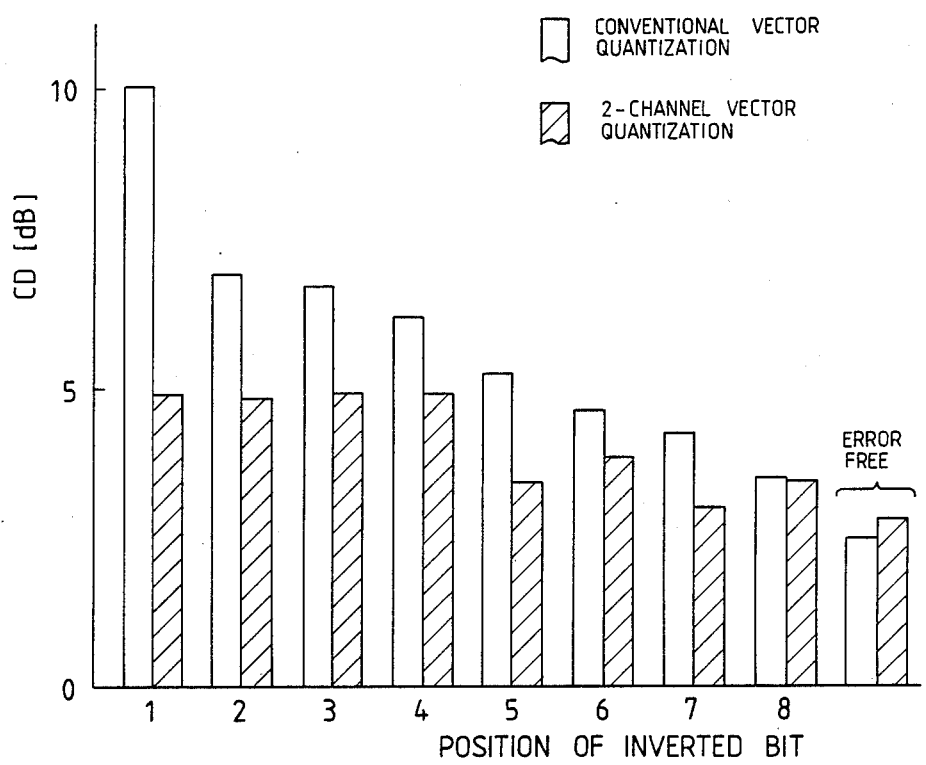
FIG. 14 is a graph showing spectrum distortions by code errors in the case of applying the present invention to the quantization of a linear prediction parameter in FIG. 12, in comparison with spectrum distortions in the case of employing the conventional vector quantization method.

Next, a description will be given of the application of the present invention to the quantization of the linear prediction parameters $\{\alpha_i\}$ in the speech coding described above with regard to FIG. 12. At first, the linear prediction coefficients $\{\alpha_i\}$ are converted to LSP (Linear Spectrum Pair) parameters which allow ease in keeping the filters stable and excellent in interpolation characteristic (U.S. Pat. No. 4,393,272). The vector-scalar quantization is performed for the LSP parameters, using 8 bits for the vector portion and 13 bits for the scalar portion. In FIG. 14 there is shown the comparison between the ordinary vector quantization and the quantization of the present invention in terms of a spectrum distortion (i.e. an LPC cepstrum distance) in the case where each 8-bit code corresponding to the vector portion is forcibly inverted and decoded. The abscissa represents the cepstrum distance and the ordinate the inverted bit position in the code, white bars shows the spectrum distortion by the ordinary vector quantization and the stripped bars by the vector quantization according to the present invention. The reason for the evaluation in terms of spectrum distortion is that a code error in the linear prediction parameters such as the LSP parameters is directly reflected as a quantization distortion of coded speech. It should be noted that the smaller the value of cepstrum distance is, the less distortion produced in the reconstructed signal. FIG. 14 indicates that the two-channel quantization according to the present invention lessens the influence on the spectrum distortion as compared with the ordinary quantization method. For an error-free channel, the ordinary vector quantization is superior to the vector quantization of the present invention, but the difference is very slight.

As described above, according to the vector quantization method of the present invention, since one input vector is quantized in a plurality of channels by use of plural codebooks, the unit of quantized codes is split and, as a result of this, the probability that all codes thus split become erroneous during transmission is far lower than the transmission error rate of ordinary quantized codes which are not divided. In other words, the region of the damage by a 1-bit code error is significantly limited. Accordingly, damage to the decoded vector is alleviated. On the other hand, when there are no code errors, since the combination of output codes is determined so that the average of candidate vectors of respective channels minimizes the distortion between them and the input vector, the vector quantization of the present invention can be expected to have substantially the same performance as the ordinary single-channel vector quantization for the same amount of information.

Furthermore, the plural-channel vector quantization according to the present invention has, in addition to robustness against code errors, the advantages of significant reduction of the storage capacity of codebooks and the reduction of the amount of computation for retrieving candidate vectors for quantization as shown in Tables I and II. Besides, by limiting the candidate vectors to be retrieved to the vicinity of the input vector in each codebook, the amount of computation can be reduced with substantially no lowering of the performance.

Accordingly, the use of the quantization method according to the present invention will provide for enhanced performance in speech waveform coding and image coding. The present invention is of particular utility when employed in the coding in which there are channel errors and information compression is needed.

It will be apparent that many modifications and variations may be effected without departing from the scope of the novel concepts of the present invention.

What is claimed is:

1. A multiplexed vector quantizer comprising:
   a plurality of codebook storage means, each having prestored therein a predetermined number of candidate vectors;
   selection means for selecting a set of candidate vectors each from one of the plurality of codebook storage means;
   averaging means for averaging the set of candidate vectors and producing an averaged vector;
   distortion calculating means whereby a distortion between an input vector and the averaged vector of the set of candidate vectors is calculated for each of a plurality of different sets of candidate vectors;
   minimum distortion determining means for determining the set of candidate vectors whose averaged vector provides the smallest distortion; and
   multiplexing means for multiplexing and outputting the codes representing the candidate vectors of the sets determined by the minimum distortion determining means.

2. The multiplexed vector quantizer of claim 1, wherein the multiplexing means is means for time-multiplexing the codes representing the candidate vectors.

3. The multiplexed vector quantizer of claim 1, wherein the distortion calculating means is means for calculating, as the distortion, a squared distance between the input vector and the averaged vector.

4. The multiplexed vector quantizer of claim 1, wherein the distortion calculating means is means for calculating, as the distortion, a weighted squared distance between the input vector and the averaged vector.

5. The multiplexed vector quantizer of claim 1, wherein the distortion calculating means includes substracting means for computing a difference vector between the averaged vector and the input vector and square summing means for calculating the sum of squares of respective elements of the difference vector and outputting the sum as the distortion.

6. The multiplexed vector quantizer of claim 1, wherein the distortion calculating means includes:
   table memory means wherein sums of squares of respective elements of a vector, which is the sum of the candidate vectors of each of the sets, each selected from one of the plurality of codebook storage means, have been stored corresponding to the respective sets of candidate vectors;
   inner product calculating means for calculating an inner product of the input vector and each set of candidate vectors, each selected from one of the plurality of codebook storage means; and
   subtracting means for calculating a difference between the sum of the inner products from the inner product calculating means and the sum of squares corresponding to the selected set of candidate vectors read out of the table memory and outputting the calculated difference as the distortion.

7. The multiplexed vector quantizer of claim 1, wherein the distortion calculating means includes:
   multiplying means which multiplies the input vector and a weighting vector input corresponding thereto and outputs a weighted input vector;
   table memory means wherein a constant vector, which uses as each of its elements, the square of the sum of corresponding elements of respective candidate vectors of each of the sets, each selected from one of the plurality of codebook storage means, has been stored corresponding to each of the sets;
   first inner product calculating means for calculating inner products of the candidate vectors of the sets selected from the plurality of codebook storage means and the weighted input vector from the multiplying means;
   second inner product calculating means for calculating an inner product of the constant vector read out of the table memory means corresponding to the selected set of candidate vectors and the weighting vector; and
   adding means for outputting, as the distortion, the difference between the inner products from the first and second inner product calculating means.

8. The multiplexed vector quantizer of any one of claims 1 to 7, wherein two codebooks are provided.

9. The multiplexed vector quantizer of claim 1, wherein the input vector is composed of k elements and the plurality of codebook storage means has stored therein an X-codebook which has N candidate vectors $x_j$, wherein $j = 0, 1, \ldots, N-1$, each consisting of k elements, and a Y-codebook which has N candidate vectors $y_m$, where $m = 0, 1, \ldots, N-1$, each consisting of k elements, k being a positive integer and N being an integer equal to or greater than 2.

10. The multiplexed vector quantizer of claim 9, wherein, letting i-th elements of the input vector and the candidate vectors $x_j$ and $y_m$ be represented by $u(i)$, $x(i,j)$ and $y(i,m)$, respectively, the distortion calculating means is means for calculating, as the distortion for the candidate vectors $x_j$ and $y_m$ of the selected set $(j, m)$, a distortion $d'_{j,m}$ which is defined by the following equations:

$$d'_{j,m} = \sum_{i=0}^{k-1} -2u(i)\{x(i,j) + y(i,m)\} + F(j,m) \quad (1)$$

$$F(j,m) = \sum_{i=0}^{k-1} \{x(i,j) + y(i,m)\}^2 \quad (2)$$

11. The multiplexed vector quantizer of claim 10, wherein the distortion calculating means includes table memory means wherein values obtained by calculating $F(j,m)$ from Eq. (2) for all combinations $(j,m)$ of the candidate vectors $x_j$ and $y_m$ have been stored corresponding to the combinations (j, m), and the distortion calculating means reads out of the table memory means the value of F(j,m) corresponding to the selected set of candidate vectors (j, m) and then calculates the distortion defined by Eq. (1).

12. The multiplexed vector quantizer of claim 9, wherein, letting i-th elements of an input weighting vector w, the input vector u and the candidate vectors $x_j$ and $y_m$ be represented by w(i), u(i), x(i,j) and y(i,m), respectively, the distortion calculating means is means for calculating, as the distortion for the candidate vectors $x_j$ and $y_m$ of the selected set (j, m), a distortion $d'_{j,m}$ which is defined by the following equations:

$$d'_{j,m} = \sum_{i=0}^{k-1} -2w(i)u(i)\{x(i,j) + y(i,m)\} + \sum_{i=0}^{k-1} w(i)F(i,j,m) \quad (1)$$

$$F(i,j,m) = \{x(i,j)+y(i,m)\}^2 \quad (2)$$

13. The multiplexed vector quantizer of claim 12, wherein the distortion calculating means includes a table memory for storing precalculated values of at least one portion of the calculation of the constant vector F(i,j,m) expressed by Eq. (2) for the selected set of candidate vectors $x_j$ and $y_m$.

14. The multiplexed vector quantizer of claim 1, wherein the multiplexing means is means for frequency multiplexing the codes respectively representing the candidate vectors.

15. A multiplexed vector quantization method in which an input signal sequence is divided into a plurality of groups, each consisting of plurality of samples and forming one input vector, and each input vector is quantized, comprising the steps of:
 (a) selecting one candidate vector from each of a plurality of channels of codebooks, each having a predetermined number of candidate vectors;
 (b) calculating a distortion between an averaged vector of the set of the selected candidate vectors and the input vector;
 (c) repeating the steps (a) and (b) for candidate vectors of a plurality of different sets selected from the plurality of codebooks and determining the set of candidate vectors which yields the smallest one of the distortions respectively calculated; and
 (d) multiplexing and outputting codes respectively representing the candidate vectors of the determined set.

16. The multiplexed vector quantization method of claim 15, wherein a squared distance between the input vector and the averaged vector is calculated as the distortion in step (b).

17. The multiplexed vector quantization method of claim 15, wherein a weighted squared distance between the input vector and the averaged vector is calculated as the distortion in step (b).

18. The multiplexed vector quantization method of claim 15, wherein each input vector is composed of k elements, one of the plurality of codebooks is an X-codebook which has N candidate vectors $x_j$, wherein j=0, 1, ..., N−1, each consisting of k elements, and another of the codebooks is a Y-codebook which has N candidate vectors $y_m$, where m=0, 1, ..., N−1, each consisting of k elements, k being a positive integer and N being an integer equal to or greater than 2.

19. The multiplexed vector quantization method of claim 18, wherein, letting i-th elements of the input vector u, the candidate vectors $x_j$ and $y_m$ be represented by u(i), x(i,j) and y(i,m), respectively, step (b) is a step of calculating, as the distortion for the candidate vectors $x_j$ and $y_m$ of the selected set (j, m), a distortion $d'_{j,m}$ which is defined by the following equations:

$$d'_{j,m} = \sum_{i=0}^{k-1} -2u(i)\{x(i,j) + y(i,m)\} + F(j,m) \quad (1)$$

$$F(j,m) = \sum_{i=0}^{k-1} \{x(i,j) + y(i,m)\}^2 \quad (2)$$

20. The multiplexed vector quantization method of claim 19, wherein step (b) is a step of calculating the distortion $d'_{j,m}$ defined by Eq. (1), using a table memory having stored therein values obtained by precalculating, for all sets (j, m), the constants F(j,m) defined by Eq. (2).

21. The multiplexed vector quantization method of claim 20, wherein step (b) is a step of calculating the inner product of the input vector u and each of the candidate vectors $x_j$ and $y_m$ and calculating, as the distortion $d'_{j,m}$, the difference between the sum of the inner products and the constant F(j,m) read out of the table memory.

22. The multiplexed vector quantization method of claim 18, wherein, letting i-th elements of an input weighting vector w, the input vector u and the candidate vectors $x_j$ and $y_m$ be represented by w(i), u(i), x(i,j) and y(i,m), respectively, step (b) is a step of calculating, as the distortion for the candidate vectors $x_j$ and $y_m$ of the selected set (j, m), a distortion $d'_{j,m}$ which is defined by the following equations:

$$d'_{j,m} = \sum_{i=0}^{k-1} -2w(i)u(i)\{x(i,j) + y(i,m)\} + \sum_{i=0}^{k-1} w(i)F(i,j,m) \quad (1)$$

$$F(i,j,m) = \{x(i,j)+y(i,m)\}^2 \quad (2)$$

23. The multiplexed vector quantization method of claim 22, wherein step (b) is a step of calculating the distortion $d'_{j,m}$ defined by Eq. (1), using a table memory having stored therein precalculated values of at least one portion of the calculation of the constant vector F(i,j,m) defined by Eq. (2) for the selected set of candidate vectors $x_j$ and $y_m$.

24. The multiplexed vector quantization method of claim 22, wherein the calculation of Eq. (1) in step (b) includes a step of multiplying the input vector u and the weighting vector w and a step of calculating the inner product of the multiplied result and each of the candidate vectors $x_j$ and $y_m$.

25. The multiplexed vector quantization method of claim 18, wherein, letting i-th elements of an input weighting vector w, the input vector u and the candidate vectors $x_j$ and $y_m$ be represented by w(i), u(i), x(i,j) and y(i,m), respectively, step (b) is a step of calculating, as the distortion for the candidate vectors $x_j$ and $y_m$ of the selected set (j, m), a distortion $d_{j,m}$ which is defined by the following equation:

$$d_{j,m} = \sum_{i=0}^{k-1} w(i) \{u(i) - \tau \cdot x(i,j) - \tau \cdot y(i,m)\}^2$$

where $\tau$ is an arbitrary positive integer.

26. The multiplexed vector quantization method of claim 18, wherein step (b) is a step of calculating, as the distortion for the candidate vectors $x_j$ and $y_m$ of the selected set (j, m), a distortion $d_{j,m}$ which is defined by the following equations:

$$d_{j,m} = \mu |u - v_{j,m}|^2 + (1-\mu)\{|u-x_j|^2 + |u-y_m|^2\}/4$$

$$v_{j,m} = (x_j + y_m)/2$$

where $\mu$ is an arbitrary constant in the range of $0 \leq \mu \leq 1$.

27. The multiplexed vector quantization method of claim 18, wherein step (b) is a step of calculating, as the distortion for the candidate vectors $x_j$ and $y_m$ of the selected set (j, m), a distortion $d_{j,m}$ which is defined by the following equation:

$$d_{j,m} = \sum_{f=0}^{N-1} \sum_{g=0}^{N-1} |u - (x_j + y_m)/2|^2 q(f|j) q(g|m)$$

where $q(f|j)$ and $q(g|m)$ represent the conditional probability that the codes j and m indicating the candidate vectors $x_j$ and $y_m$ erroneously change to g and f in a transmission channel, respectively.

28. The multiplexed vector quantization method of claim 15, wherein a step of preparing the plurality of codebooks includes:
   (1) a step in which a predetermined number of input sample vectors are arbitrarily divided into a plurality of groups to produce a plurality of initial codebooks;
   (2) a step in which training vectors of a number sufficiently larger than the predetermined number are used as input vectors and they are sequentially quantized by the multiplexed vector quantization method using the plurality of codebooks, thereby determining the set of candidate vectors to which each training vector corresponds;
   (3) a step in which the contents of the plurality of codebooks except an arbitrary one of them are fixed, an arbitrary candidate vector of the said one codebook is regarded as a variable vector, an equation in which the sum of distortions for all training vectors containing the said one candidate vector in their corresponding sets of candidate vectors is partially differentiated by the variable vector, is set to zero, and a vector value obtained by solving the equation for the variable vector is replaced, as a new candidate vector, for the said one candidate vector;
   (4) a step in which step (3) is repeated for all the other candidate vectors of the said one initial codebook and they are replaced with new candidate vectors, thereby renewing the contents of the said one initial codebook; and
   (5) a step in which steps (2), (3), and (4) are repeated for all the other initial codebooks to renew their contents.

29. The multiplexed vector quantization method of claim 28, wherein the step of producing the plurality of codebooks includes a step of repeating the steps (2), (3) and (4) a plurality of times for the same codebook.

30. The multiplexed vector quantization method of claim 28, wherein the step of producing the plurality of codebooks includes a step of repeating the steps (2), (3), (4) and (5) a plurality of times.

31. The multiplexed vector quantization method of claim 15, wherein the step (d) is a step of time multiplexing and outputting the respective codes representing candidate vectors of the determined set.

32. The multiplexed vector quantization method of claim 15, wherein the step (d) is a step of frequency multiplexing and outputting the respective codes representing candidate vectors of the determined set.

33. The multiplexed vector quantization method of claim 31 or 32, wherein the codes representing the candidate vectors of the determined set are indices indicating the respective candidate vectors.

34. The multiplexed vector quantization method of claim 18, wherein the averaged vector is defined by the following equation:

$$v_{j,m} = \{2^{2r(x)} x_j + 2^{2r(y)} y_m\} / \{2^{2r(x)} + 2^{2r(y)}\}$$

where r(x) and r(y) are transmission rates of the codes representing the candidate vectors $x_j$ and $y_m$, respectively.

35. The multiplexed vector quantization method of claim 18, wherein, letting an i-th element of the input vector u and g-th elements of the candidate vectors $x_j$ and $y_m$ be represented by u(i), x(g,j) and y(g,m), respectively, the step (b) is a step of calculating, as the distortion for the candidate vectors $x_j$ and $y_m$ of the selected set, a distortion $d_{j,m}$ which is defined by the following equation:

$$d_{j,m} = \sum_{i=0}^{k-1} \left[ u(i) - \tau \sum_{g=0}^{k-1} h(i,g)\{x(g,j) + y(g,m)\} \right]^2$$

where h(i,g) is an element at an i-th row and a g-th column of a matrix for obtaining a convolution product and $\tau$ is a parameter which minimizes the distortion $d_{j,m}$.

* * * * *